United States Patent [19]
Lin et al.

[11] Patent Number: 5,974,476
[45] Date of Patent: Oct. 26, 1999

[54] ON-CHIP INPUT/OUTPUT DEVICE HAVING PROGRAMMABLE I/O UNIT BEING CONFIGURED BASED UPON INTERNAL CONFIGURATION CIRCUIT

[75] Inventors: Tin-Hao Lin, Hsinchu; Jeng-Huang Wu, Taipei, both of Taiwan

[73] Assignee: Faraday Technology Corp., Hsinchu, Taiwan

[21] Appl. No.: 08/989,287

[22] Filed: Dec. 12, 1997

[30] Foreign Application Priority Data

Oct. 7, 1997 [TW] Taiwan ................................. 86216970

[51] Int. Cl.$^6$ ...................... G06F 13/14; G01R 31/3187
[52] U.S. Cl. .............................. 710/14; 710/16; 710/104; 714/733; 326/30; 326/38
[58] Field of Search ................................ 710/14, 16, 104; 714/733; 326/30, 38

[56] References Cited

U.S. PATENT DOCUMENTS

| | | | |
|---|---|---|---|
| 5,490,254 | 2/1996 | Ziegler et al. | 710/100 |
| 5,502,400 | 3/1996 | Livolsi et al. | 326/30 |
| 5,583,454 | 12/1996 | Hawkins et al. | 326/81 |
| 5,671,234 | 9/1997 | Phillips et al. | 714/726 |

OTHER PUBLICATIONS

Hastie, N.; Cliff, R., "The implementation of hardware subroutines on field programmable gate arrays," Custom Integrated Circuits Conference, 1990, Proceedings of the IEEE 1990, pp. 31.4/1–31.4/4.

*Primary Examiner*—Thomas C. Lee
*Assistant Examiner*—Albert Wang
*Attorney, Agent, or Firm*—Knobbe, Martens, Olson & Bear, LLP

[57] ABSTRACT

An input/output (I/O) device with programmable I/O characteristics is provided for use on an integrated circuit to serve as a communication interface whose input/output characteristics can be set through programmable means to be matched to the external circuitry to which the IC chip is connected for use. This allows the IC chip on which the I/O device is provided to be matched for use with various kinds of external systems. Further, the I/O device can also be provided with a self-control feature that can detect whether the I/O characteristics of the I/O device are matched to the external circuitry and, if not, automatically set the I/O device to the required I/O characteristic. The I/O device can prevent an IC chip from being discarded due to a mismatch in the I/O characteristics with the external circuitry to which the IC chip is connected for use.

18 Claims, 12 Drawing Sheets

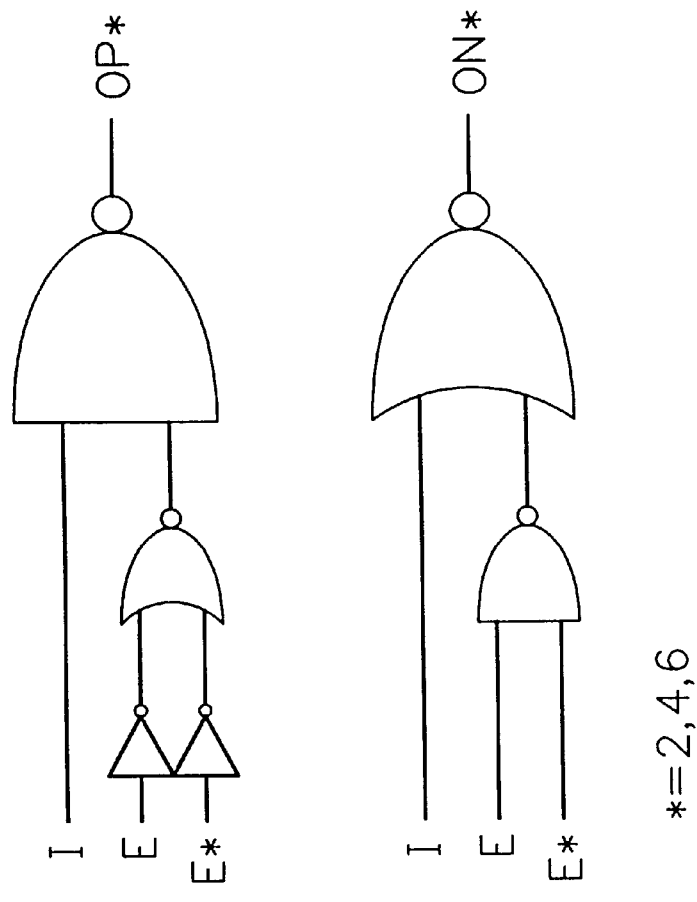
\*=2,4,6
FIG. 12
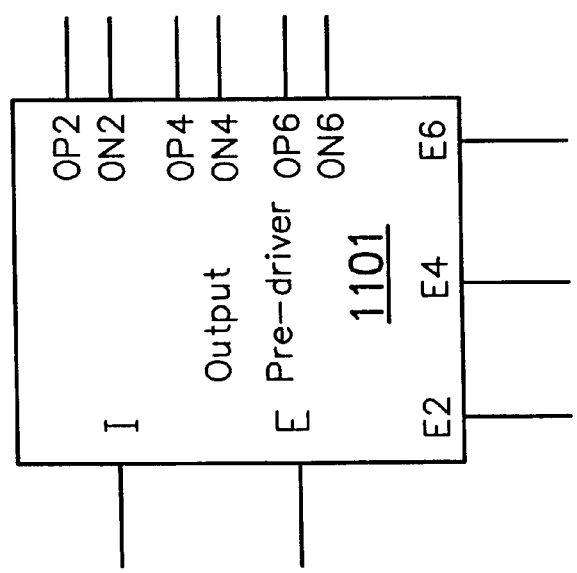

ON-CHIP INPUT/OUTPUT DEVICE HAVING PROGRAMMABLE I/O UNIT BEING CONFIGURED BASED UPON INTERNAL CONFIGURATION CIRCUIT

BACKGROUND OF THE INVENTION

1. Field of the Invention

This invention relates to input/output (I/O) devices for integrated circuits, and more particularly, to an I/O device for use on an integrated circuit to serve as a communication interface whose input/output characteristics is programmable after foundry to be matched to the external circuitry to which the IC chip is connected for use. The invention also relates to a self-control I/O device which can detect whether the I/O characteristics of the I/O device are matched to the external circuitry and, if not, automatically set the I/O device to the required I/O characteristics.

2. Description of Related Art

FIG. 1 is a schematic diagram showing the top view of a conventional IC chip. As shown, the layout area of the IC chip is partitioned into a center area 11, where the core functionality of the IC chip is provided, and an I/O area 12, where a plurality of I/O devices serving as a communication interface for the core circuitry of the IC chip to perform I/O functions with external circuitry is provided. These I/O devices are formed together with the core circuitry on the center area 11 in the foundry process for the IC chip.

FIG. 2 is a schematic diagram showing the inside structure of each of the above-mentioned I/O devices provided on the I/O area 12 in the IC chip 10 of FIG. 1. As shown, this I/O device includes an output buffer 21 and an input receiver 22, both of which are connected between the external circuitry and the core circuitry provided on the center area 11 of the IC chip 10 of FIG. 1. The output characteristic of the output buffer 21 and the input characteristic of the input receiver 22 are factory-set and fixedly built in the I/O component 20 during the foundry process in compliance with the particular external circuitry to which the IC 10 is to be connected for use. Once set, the I/O characteristics of the I/O component 20 cannot be changed.

FIG. 3 is a schematic diagram showing the various stages in a typical IC manufacturing process, which include design, photomasking, foundry, packaging, and system verification. If the I/O characteristics of an IC chip are mismatch to the external circuitry to which the IC chip is connected for use, that IC chip will fail to pass the system verification. The mismatch can be caused by several reasons as described below.

For the output buffer 21, the mismatch in its output characteristic can be caused by such factors as variable loading, system variation, mismatch in the specifications between the IC chip and the external circuitry, and noise, to name a few. For the input receiver 22, the mismatch in its input characteristic can be caused by such factors as a mismatch in CMOS/TTL (complementary metal-oxide semiconductor and transistor-transistor logic) pull-up/pull-down modes, whether a noise-immune Schmitt trigger is provided, and so on.

In the event of a mismatch in the I/O characteristic, since the I/O characteristics are factory-set and fixedly built in the I/O device, they cannot be changed thereafter to match the external circuitry. As a result, the IC chip may have to be discarded and new IC chips with matched I/O characteristics are to be manufactured. This will not only cause a waste in the semiconductor materials but cause a delay in the delivery of the ordered IC products to the customer, both of which would cause loss to the manufacturer.

SUMMARY OF THE INVENTION

It is therefore an objective of the present invention to provide an I/O device with programmable I/O characteristics for IC chips, whose I/O characteristics can be arbitrarily set at any time after foundry in such a manner as to be matched to the external circuitry to which the IC chip is connected for use.

It is another an objective of the present invention to provide a self-control I/O device with programmable I/O characteristics for IC chips, which can detect whether the I/O characteristics of the I/O device are matched to the external circuitry and, if not, automatically make a change in the I/O characteristics so that they are matched to the external circuitry.

In accordance with the foregoing and other objectives of the present invention, an I/O device with programmable I/O characteristics for IC chips is provided. In another aspect of the invention, a self-control I/O device for IC chips is provided.

The I/O device of the invention includes the following constituent elements: a programmable I/O unit serving as a data buffer between the core circuitry of the IC chip and the external circuitry to which the IC chip is connected for use, the programmable I/O unit being capable of being set to one of a plurality of combinations of built-in I/O characteristics; and I/O configuration means, coupled to the programmable I/O unit, for use to control the programmable I/O unit to be set to the desired combination of I/O characteristics that are matched to the external circuitry. In this I/O device, the programmable I/O unit and the I/O configuration means are both integrally formed on the IC chip, allowing for a change in the I/O characteristics of the I/O device to match to the external circuitry.

In the foregoing I/O device, the programmable I/O unit includes the following constituent elements: an output buffer serving as an output data buffer for the data output from the core circuitry of the IC chip to the external circuitry, capable of being set to an output characteristic selected from a plurality of built-in output characteristics through programming by using the I/O configuration means; and an input receiver serving as an input data buffer for the data input from the external circuitry to the core circuitry of the IC chip, capable of being set to an input characteristic selected from a plurality of built-in input characteristics through programming by using the I/O configuration means.

Still, the output buffer includes the following constituent elements: an output pre-driver coupled to the core circuitry of the IC chip to receive the data output therefrom; and a P/N buffer, coupled between the output pre-driver and the external circuitry, capable of being set to one of a plurality of built-in output driving capabilities through programming by using the I/O configuration means. Further, the output pre-driver includes a plurality of output pre-driver units coupled to the core circuitry of the IC chip to receive the data output therefrom and also coupled to the I/O configuration means; and the P/N buffer includes a plurality of P/N buffer units each being paired to one of the output pre-driver units in the output pre-driver. Each of the paired output pre-driver units and P/N buffer units is provided with a unique built-in output driving capability, allowing the output buffer to be set to one of a plurality of output driving capabilities through programming by using the I/O configuration means.

Alternatively, the output buffer includes the following constituent elements: a plurality of output pre-driver units whose input ends are tied together to the core circuitry of the IC chip to receive the data output therefrom and also coupled to the I/O configuration means; and a plurality of P/N buffer units each being paired to one of the output pre-driver units. In this architecture, each of the paired output pre-driver units and P/N buffer units is provided with a unique built-in output driving capability, allowing the output buffer to be set to one of a plurality of output driving capabilities through programming by using the I/O configuration means. Further, each of the output pre-driver includes a plurality of output pre-driver units coupled to the core circuitry of the IC chip to receive the data output therefrom and also coupled to the I/O configuration means; and each of the P/N buffer includes a plurality of P/N buffer units each being paired to one of the output pre-driver units in the output pre-driver. Each of the paired output pre-driver units and P/N buffer units is provided with a unique built-in output driving capability, allowing the output buffer to be set to one of a plurality of output driving capabilities through programming by using the I/O configuration means.

The input receiver includes a plurality of input receiver units coupled in parallel between the external circuitry and the core circuitry of the IC chip to receive the data input from the external circuitry, each having a unique built-in input characteristic; the input receiver units being further coupled to the I/O configuration means to be selectively enabled for use by the I/O configuration means allowing the input receiver to be set to a desired input characteristic.

In another aspect, the invention provides a self-control I/O device which can detect whether the I/O characteristics of the I/O device are matched to the external circuitry and automatically set the VO device to the required I/O characteristics. This self-control I/O device includes the following constituent elements: a programmable I/O unit serving as a data buffer between the core circuitry of the IC chip and the external circuitry to which the IC chip is connected for use, the programmable I/O unit being capable of being set to one of a plurality of combinations of built-in I/O characteristics; I/O configuration means, coupled to the programmable I/O unit, for use to control the programmable I/O unit to be set to the desired combination of I/O characteristics that are matched to the external circuitry; an I/O testing circuit, coupled to the programmable I/O unit, capable of detecting whether the programmable I/O unit is matched to the external circuitry; if not, the basic I/O system generating a change request signal; and a basic I/O system, coupled to both of the I/O testing circuit and the I/O configuration means; in response to the change request signal from the I/O testing circuit, the basic I/O system requesting the I/O configuration means to send a corresponding I/O configuration signal to set the programmable I/O unit to the required set of I/O characteristics.

BRIEF DESCRIPTION OF DRAWINGS

The invention can be more fully understood by reading the following detailed description of the preferred embodiments, with reference made to the accompanying drawings, wherein:

FIG. 12 is a schematic diagram showing the inside logic structure of the output pre-driver utilized in the I/O device shown in FIG. 11;

DETAILED DESCRIPTION OF PREFERRED EMBODIMENTS

In accordance with the invention, an I/O device with programmable I/O characteristics for IC chips is provided. In another aspect of the invention, a self-control I/O device for IC chips is provided.

Figure 1:
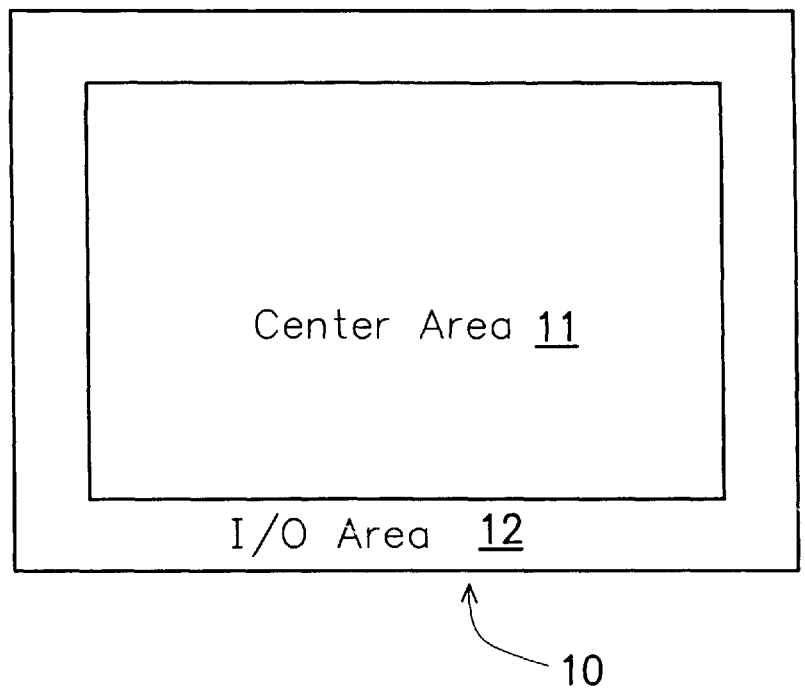
FIG. 1 is a schematic diagram showing the top view of a conventional IC chip.
Figure 2:
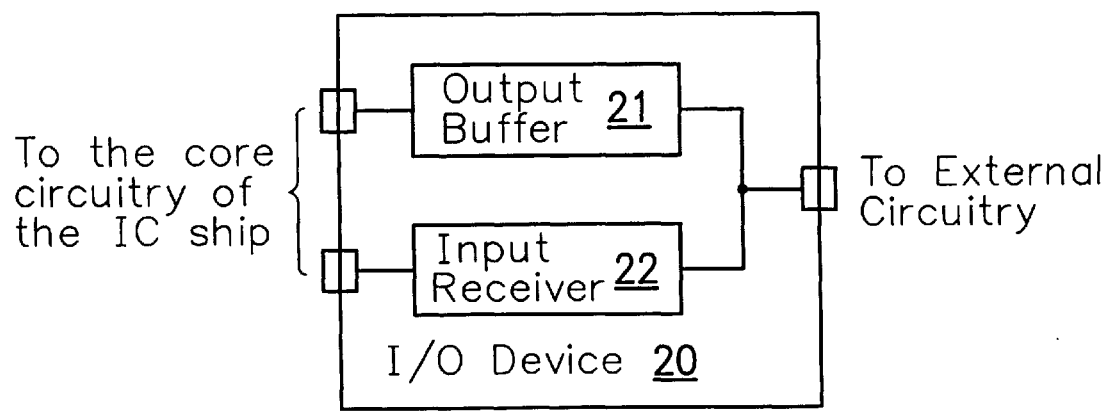
FIG. 2 is a schematic diagram showing the inside structure of an I/O device utilized in the conventional IC chip of FIG. 1.
Figure 3:
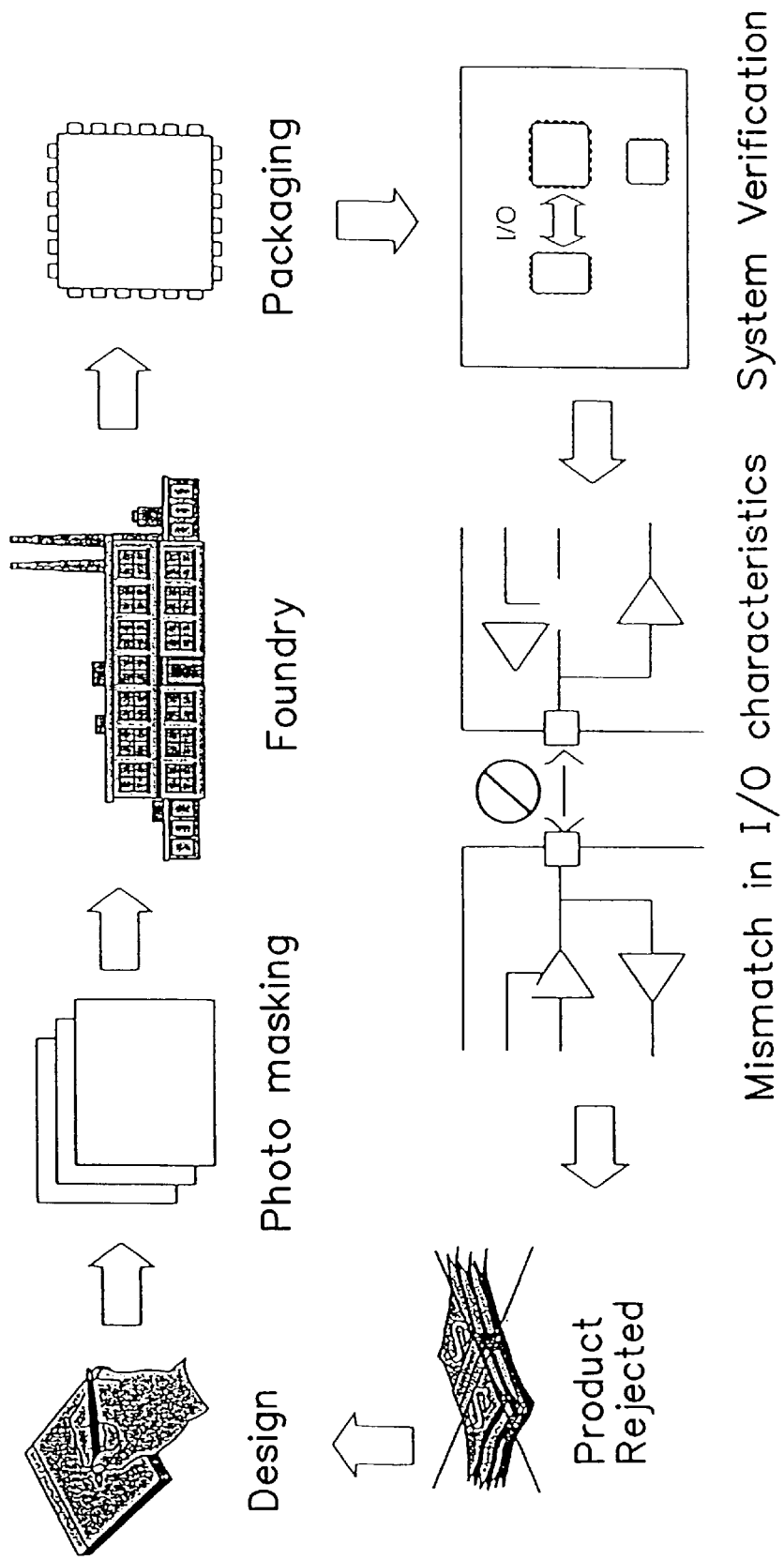
FIG. 3 is a schematic diagram showing the various stages in a typical IC manufacturing process.
Figure 4:
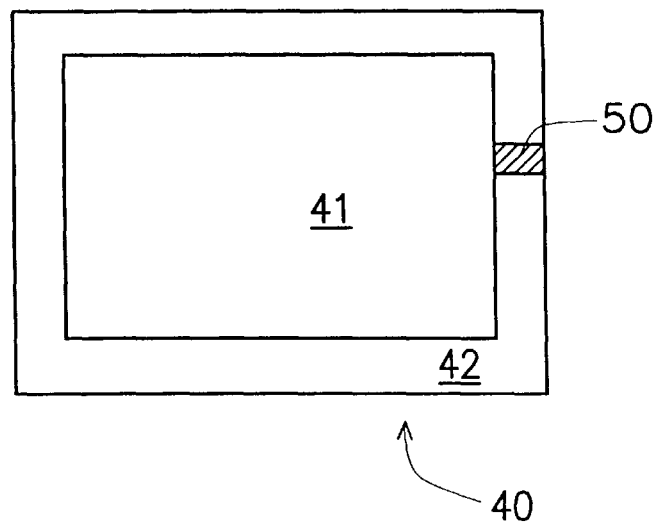
FIG. 4 is a schematic diagram showing the top view of an IC chip which is provided with the I/O device of the invention.

FIG. 4 is a schematic diagram showing the top view of an IC chip (designated by the reference numeral 40) which is provided with the I/O device of the invention (designated by the reference numeral 50). This IC chip 40 is partitioned into a center area 41, where the core circuitry of the IC chip 40 is provided, and an I/O area 42, where the I/O device 50 of the invention is provided. The I/O device 50 serves as a communication interface for the core circuitry of the IC chip 40 to perform I/O functions with the external circuitry (not shown) to which the IC chip 40 is connected for use.

Figure 5:
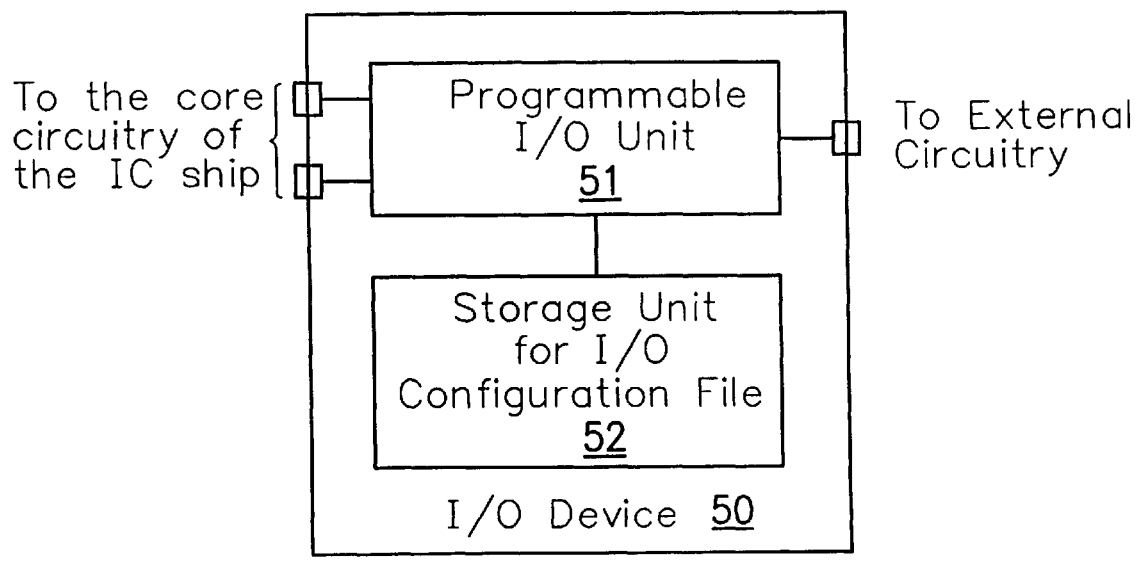
FIG. 5 is a schematic diagram showing the inside structure of the I/O device according to the first preferred embodiment of the invention.

FIG. 5 is a schematic diagram showing the inside structure of the I/O device 50. As shown, the I/O device 50 includes a programmable I/O unit 51 and a permanent storage unit 52 for storing a predefined I/O configuration file. The programmable I/O unit 51 serves as a data buffer between the external circuitry and the core circuitry provided on the center area 41 of the IC chip 40. The I/O configuration file stored in the storage unit 52 is used to store various I/O configuration codes, each can be used to set the programmable I/O unit 51 to a corresponding combination of I/O characteristics. The storage unit 52 can be a read-only memory, a set of flip-flops, or a set of latches that are capable of storing data permanently therein. The I/O configuration file can be accessed through programmable means to select an I/O configuration code that corresponds to the required I/O characteristics for the I/O device to be matched to the external circuitry.

Figure 6:
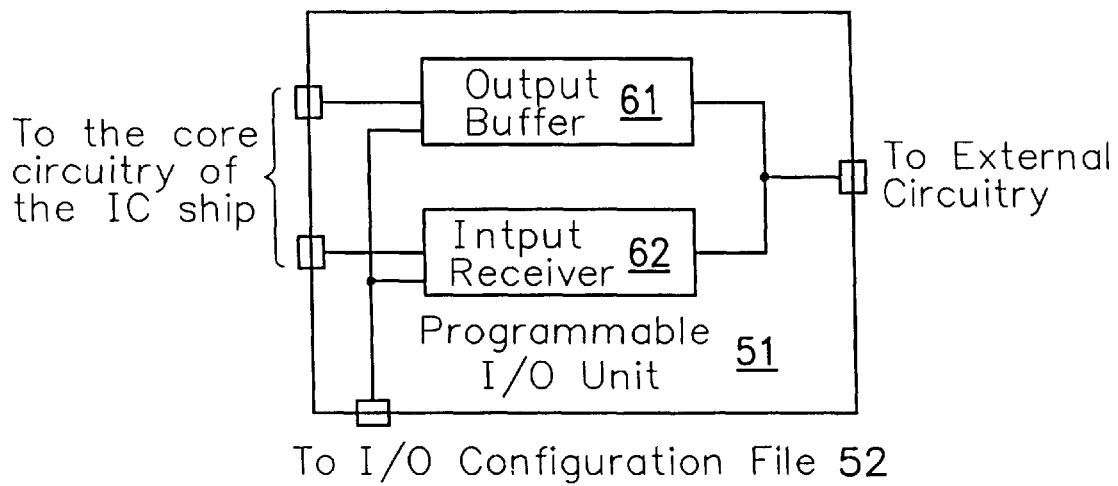
FIG. 6 is a schematic diagram showing the inside structure of a programmable I/O utilized in the I/O device according to the first preferred embodiment of the invention.

FIG. 6 is a schematic diagram showing the inside structure of the programmable I/O unit 51 utilized in the I/O device 50 of FIG. 5. As shown, the programmable I/O unit 51 includes an output buffer 61 and an input receiver 62. The output buffer 61 serves as a buffer for the output data from the core circuitry of the IC chip 40, while the input receiver 62 is used to receive input data from the external circuitry and transfers the received data to the core circuitry of the IC chip 40. The output characteristic of the output buffer 61 and the input characteristic of the input receiver 62 can be set by using the I/O configuration file stored in the storage unit 52. The output buffer 61 can be set to one of a plurality of built-in output characteristics through programming by the I/O configuration file stored in the storage unit 52, and similarly, the input receiver 62 can be set to one of a plurality of built-in input characteristics through programming by the same.

Figure 7:
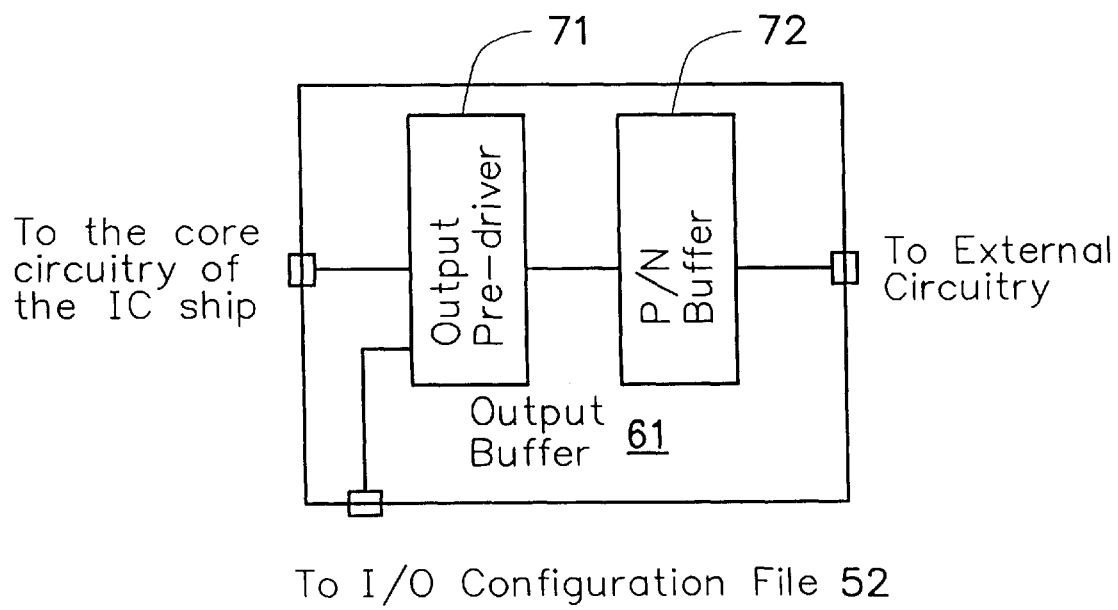
FIG. 7 is a schematic diagram showing the inside structure of an output buffer utilized in the I/O device according to the first preferred embodiment of the invention.

FIG. 7 is a schematic diagram showing the inside structure of the output buffer 61 utilized in the programmable I/O unit 51 of FIG. 6. As shown, the output buffer 61 includes an output pre-driver 71 and a P/N buffer 72. The output pre-driver 71 is connected between the core circuitry of the IC chip 40 and the P/N buffer 72. Through the output pre-driver 71, the P/N buffer 72 can be set to one of a plurality of built-in output driving capabilities through programming by the I/O configuration file stored in the storage unit 52.

Figure 8:
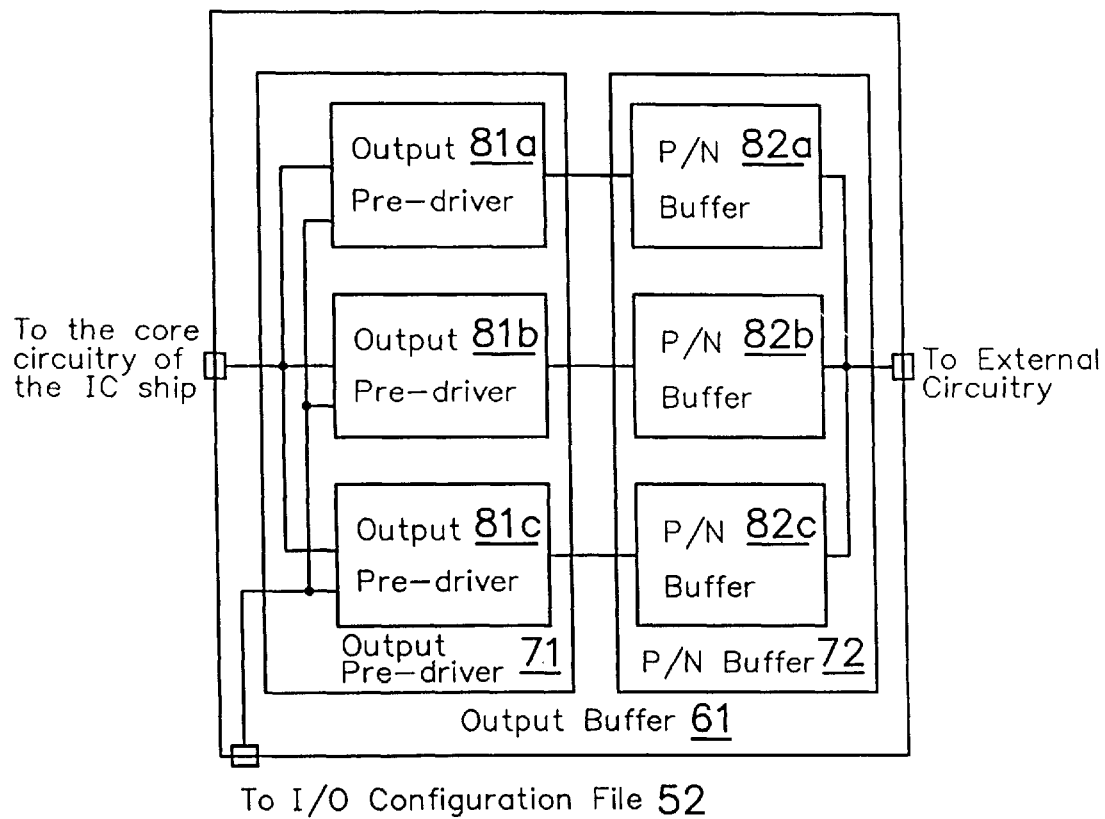
FIG. 8 is a schematic diagram showing a more detailed inside architecture of the output buffer of FIG. 7.

FIG. 8 is a schematic diagram showing the inside architecture of the output buffer 61 of FIG. 7. As shown, the output pre-driver 71 in the output buffer 61 includes a plurality of output pre-driver units 81a, 81b, 81c. These output pre-driver units 81a, 81b, 81c can be different in functionality in accordance with actual requirements. Further, the P/N buffer 72 in the output buffer 61 includes a plurality of P/N buffer units 82a, 82b, 82c, each being coupled between the external circuitry and one of the output pre-driver units 81a, 81b, 81c. These P/N buffer units 82a, 82b, 82c can be different in functionality in accordance with actual requirements. Each of the paired combinations of the output pre-driver units 81a, 81b, 81c and P/N buffer units 82a, 82b, 82c, (for example the output pre-driver unit 81a in combination with the P/N buffer unit 82a) can provide a unique output driving capability. In the case of FIG. 8, for example, three different output driving capabilities can be provided. The enable/disable state of each of these combined circuits is controlled through programming by the I/O configuration file stored in the storage unit 52, allowing the output buffer 61 to produce a driving capability selected from the three options. This allows the manufacture to set the output buffer 61 to the output driving capability that is required by the external circuitry.

In conclusion, the I/O device 50 according to the first preferred embodiment of the invention disclosed above can be set to the required I/O characteristics that are matched to the external circuitry through programming by using the I/O configuration file stored in the storage unit 52. Therefore, even after foundry, the I/O characteristics of the I/O device 50 can be arbitrarily changed to match the external circuitry to which the IC chip 40 is connected for use.

A second preferred embodiment of the invention will be disclosed in the following, with reference to FIG. 9 and FIG. 10, in which the output buffer 61 and the input receiver 62 are structured in a different manner.

Figure 9:
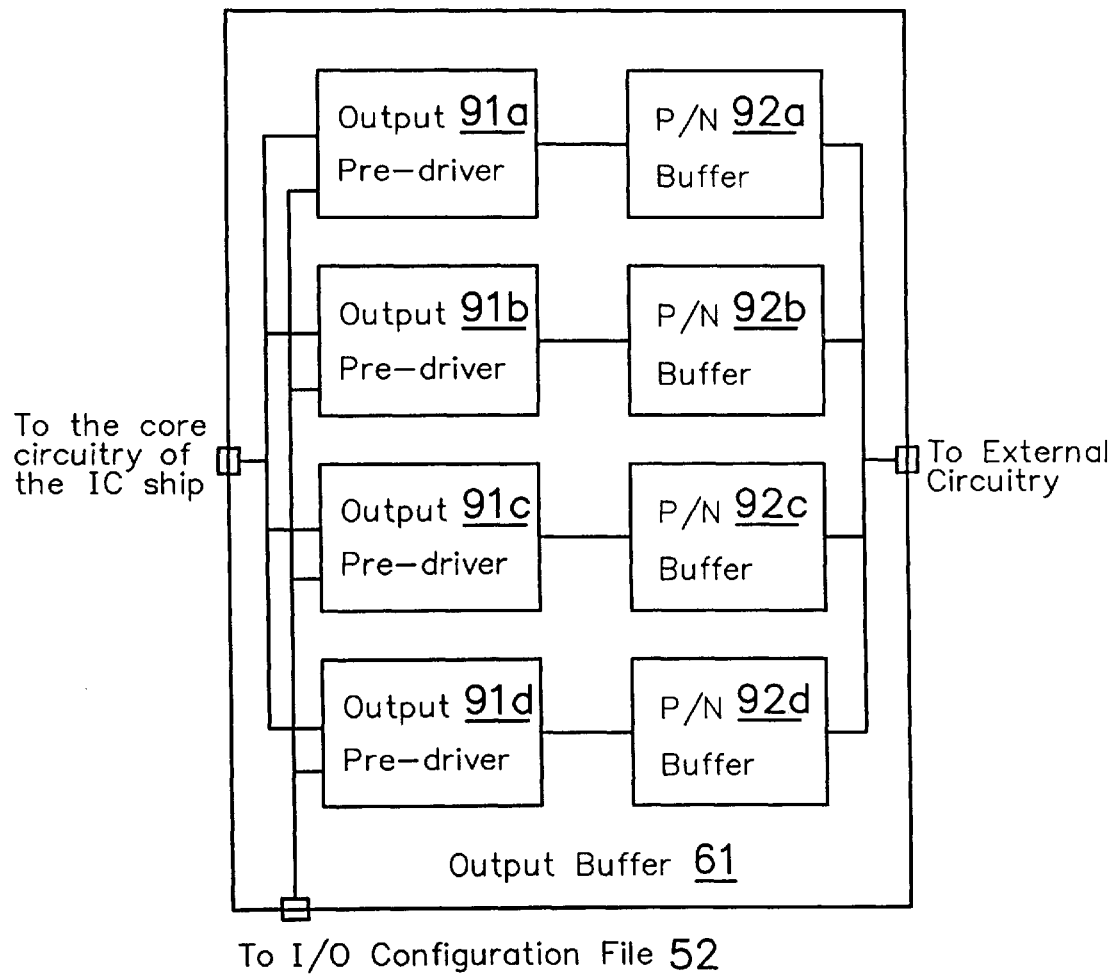
FIG. 9 is a schematic diagram showing a detailed inside structure of the output buffer utilized in the I/O device according to the second preferred embodiment of the invention.

FIG. 9 is a schematic diagram showing the inside structure of the output buffer 61 utilized in the I/O device according to the second preferred embodiment of the invention. As shown, the output buffer 61 in this embodiment includes a plurality of output pre-drivers 91a, 91b, 91c, 91d and an equal number of P/N buffers 92a, 92b, 92c, 92d each being paired to one of the output pre-drivers 91a, 91b, 91c, 91d. The P/N buffers 92a, 92b, 92c, 92d can be different in functionality in accordance with actual requirements. The P/N buffers 92a, 92b, 92c, 92d are each provided with a plurality of built-in output driving capabilities and have their output ports tied together to the output port of the output buffer 61 connected to the external circuitry. The output data from the core circuitry of the IC chip 40 are first driven by the output pre-drivers 91a, 91b, 91c, 91d, then buffered by the P/N buffers 92a, 92b, 92c, 92d before being sent out from the out-put port of the output buffer 61. The output driving capability of each of the P/N buffers 92a, 92b, 92c, 92d can be set to the desired one through programming by using the I/O configuration file stored in the storage unit 52.

Figure 10:
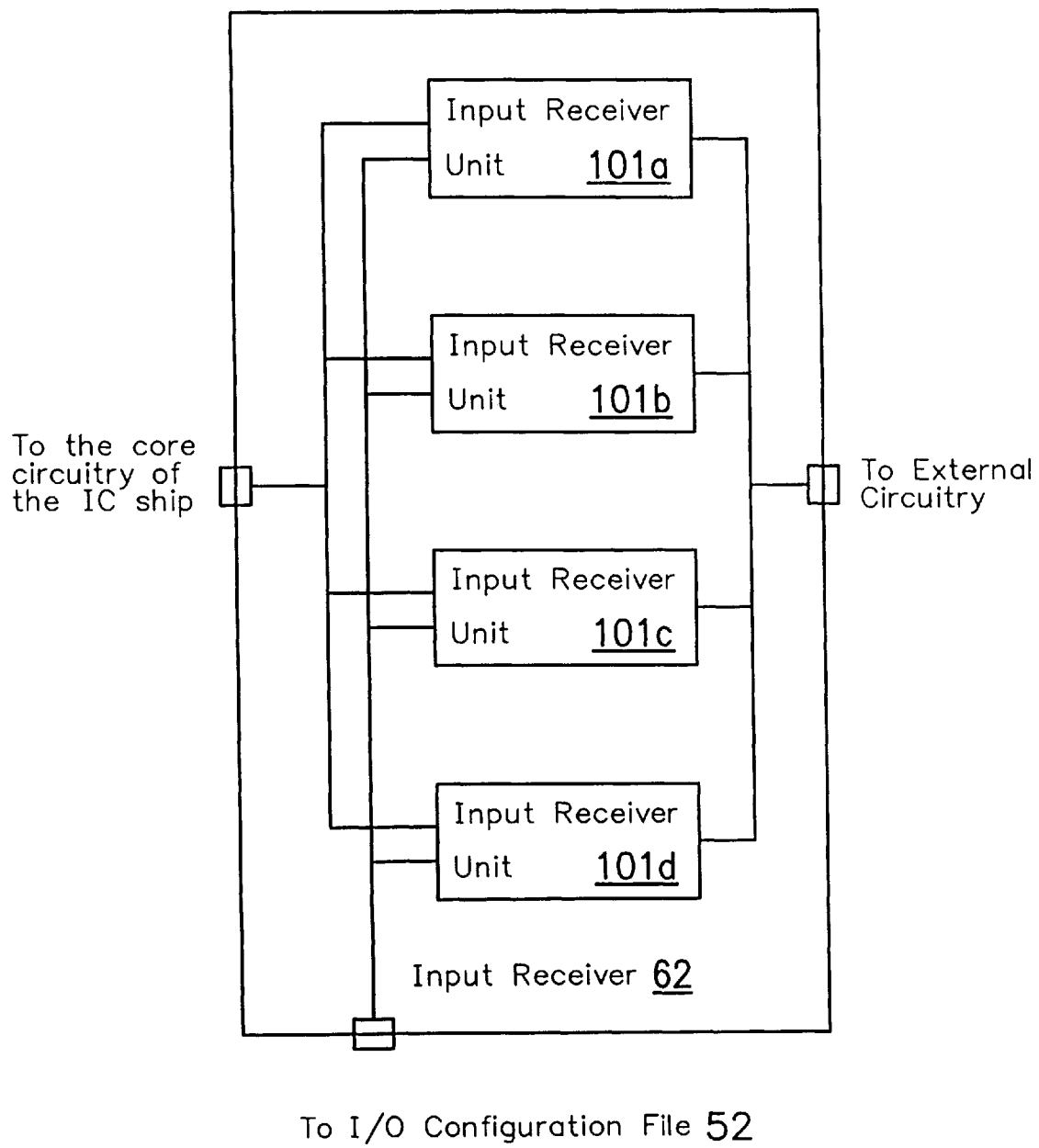
FIG. 10 is a schematic diagram showing a detailed inside structure of the input receiver utilized in the I/O device according to the second preferred embodiment of the invention.

FIG. 10 is a schematic diagram showing the inside structure of the input receiver 62 utilized in the I/O device according to the second preferred embodiment of the invention. As shown, the input receiver 62 in this embodiment includes a plurality of input receiver units 101a, 101b, 101c, 101d whose input ports are tied together to the input port of the input receiver 62 and whose output ports are tied together to the output port of the input receiver 62 connected to the core circuitry of the IC chip 40. The input characteristic of the input receiver 62 can be set to the desired one through programming by using the I/O configuration file stored in the storage unit 52 to enable the corresponding one of the input receiver units 101a, 101b, 101c, 101d while disabling all of the others.

In conclusion, the output pre-drivers 91a, 91b, 91c, 91d and the P/N buffers 92a, 92b, 92c, 92d in the output buffer 61 as well as the input receiver units 101a, 101b, 101c, 101d in the input receiver 62 allow the I/O device to be set to different I/O characteristics. The programmable I/O unit 51 can therefore be implemented with increased number of generic cells which allow the programmable I/O unit 51 to have wide range of I/O characteristics to select from, thus allowing the I/O device 50 to be matched to a wide range of external systems through programming by using the I/O configuration file stored in the storage unit 52.

A third preferred embodiment of the invention is disclosed in the following with reference to FIG. 11 through FIG. 14. In this embodiment, the I/O device of the invention is designated by the reference numeral 110 while the storage unit used to stored the I/O configuration file is designated by the reference numeral 1104.

Figure 11:
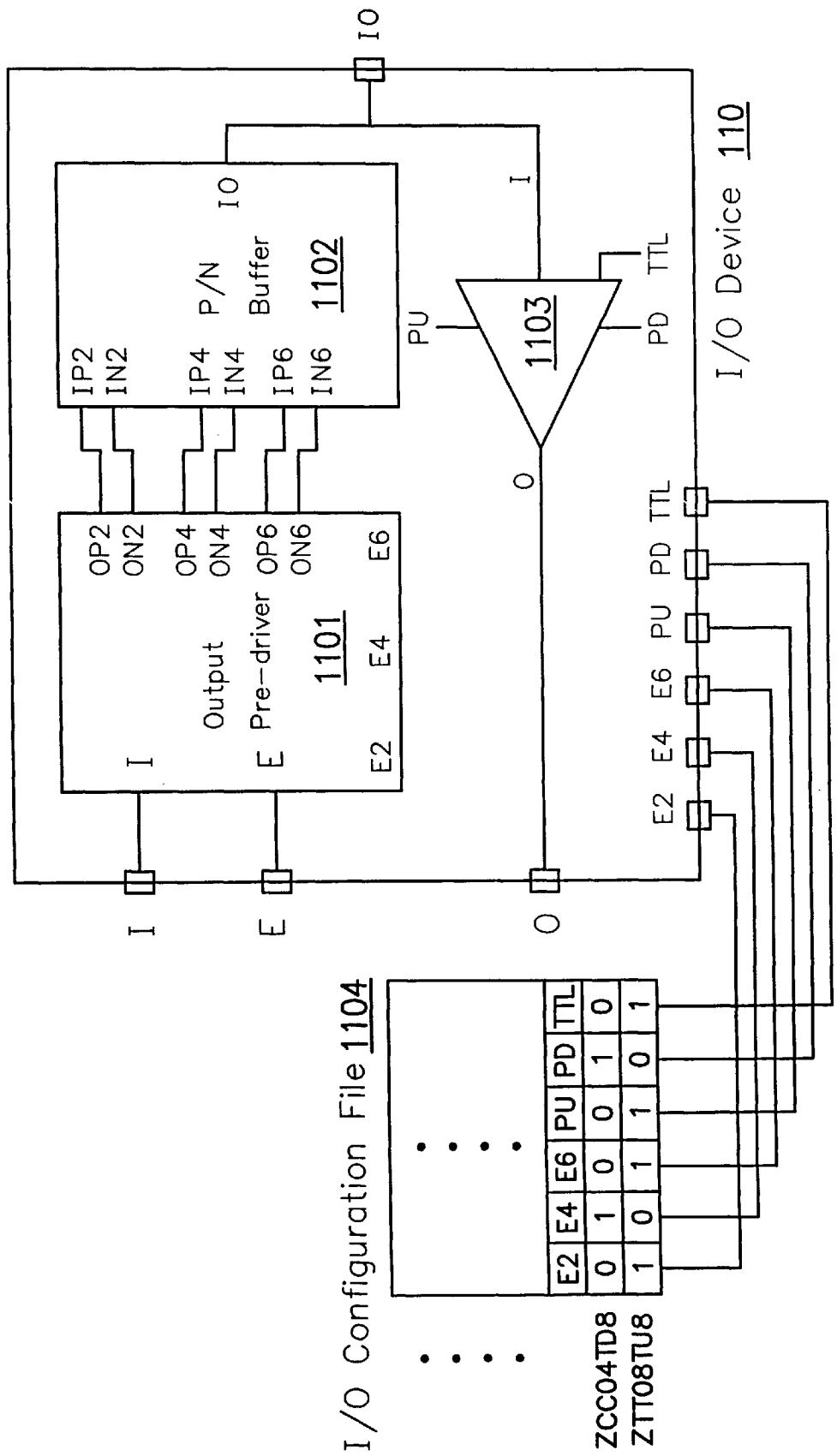
FIG. 11 is a schematic diagram showing a detailed inside structure of the I/O device and the I/O configuration file stored in the storage unit according to the third preferred embodiment of the invention.
Figure 13:
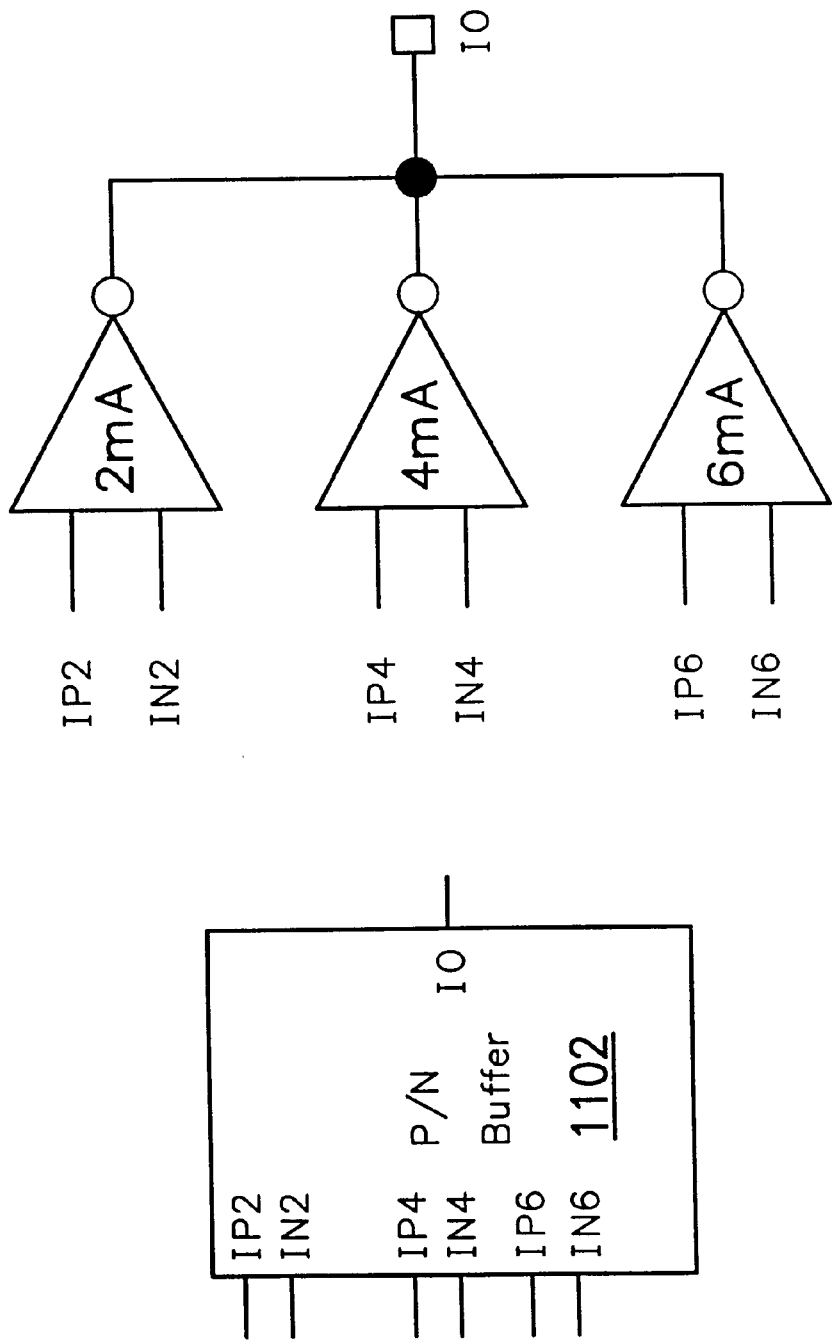
FIG. 13 is a schematic diagram showing the inside logic structure of the P/N buffer utilized in the I/O device of FIG. 11.
Figure 14:
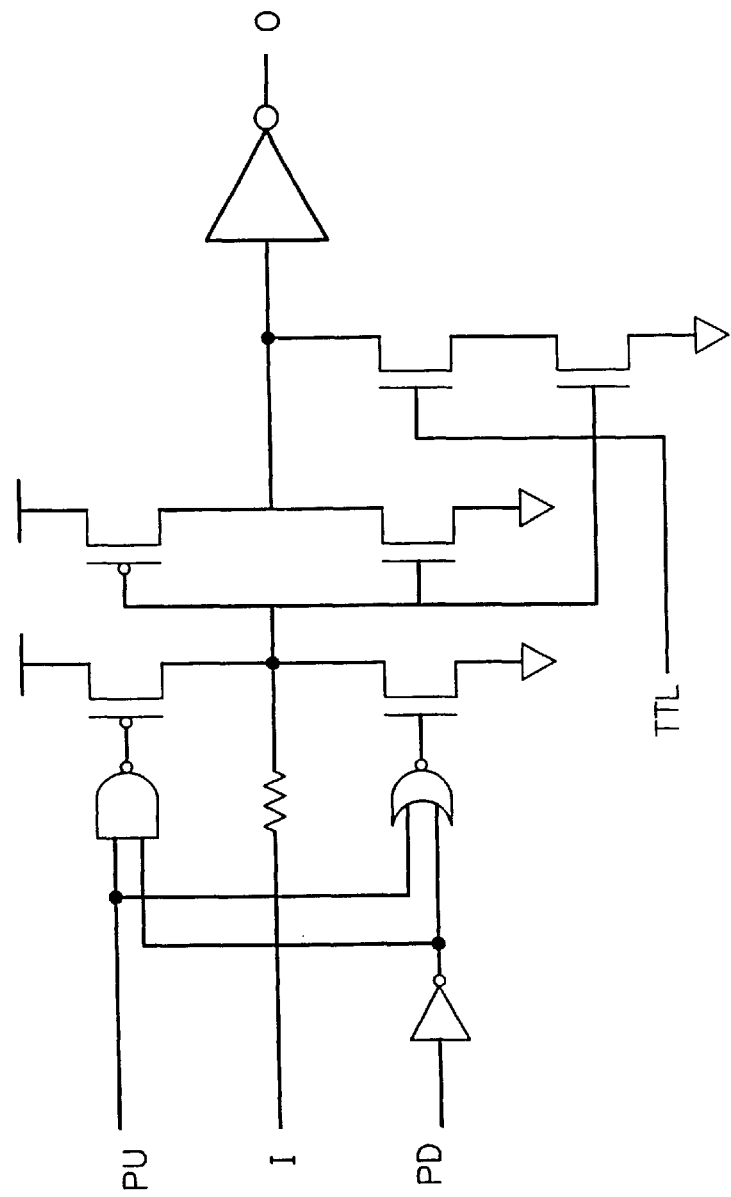
FIG. 14 is a schematic diagram showing the inside circuit structure of the input receiver utilized in the I/O device of FIG. 11.
Figure 14:
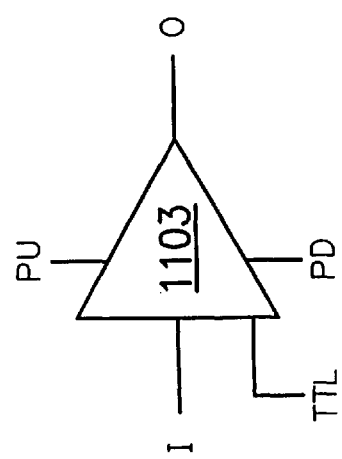

FIG. 11 is a schematic diagram showing the inside structure of the I/O device 110 and the inside data structure of the I/O configuration file stored in the storage unit 1104; FIG. 12 is a schematic diagram showing the logic structure of the output pre-driver 1101 utilized in the I/O device 110 shown in FIG. 11; FIG. 13 is a schematic diagram showing the logic structure of the P/N buffer 1102 utilized in the I/O device 110 of FIG. 11; and FIG. 14 is a schematic diagram showing the circuit structure of the input receiver 1103 utilized in the I/O device 110 of FIG. 11.

As shown in FIG. 11, the I/O device 110 of this embodiment includes an output pre-driver 1101, a P/N buffer 1102, and an input receiver 1103. The I/O device 110 has six ports E2, E4, E6, PU, PD, TTL respectively connected to receive the bits of a control word in the I/O configuration file stored in the storage unit 1104. The value of the control word [E2, E4, E6, PU, PD, TTL] determines a specific combination of I/O characteristics for the I/O device 110. For example, when the ZCC04TD8 mode in the I/O configuration file stored in the storage unit 1104 is selected, i.e., [E2, E4, E6, PU, PD, TTL]=[0, 1, 0, 0, 1, 0], the I/O device 110 is set to such a combination of I/O characteristics that its output characteristic is set to an output driving current (the abovementioned output driving capability) of 4 mA (milliampere) and its input characteristic is set to CMOS pull-down mode. Moreover, when the ZTT08TU8 mode is selected, i.e., [E2, E4, E6, PU, PD, TTL]=[1, 0, 1, 1, 0, 1], the I/O device 110 is set to have such a combination of I/O characteristics that its output characteristic is set to an output driving current of 8 mA and its input characteristic is set to TTL pull-up mode.

In conclusion, the I/O device 110 of the third preferred embodiment of the invention can be set to the desired I/O characteristic simply by selecting the corresponding value for the control word from the I/O configuration file stored in the storage unit 1104.

Self-control I/O Device

In another aspect, the invention proposes a self-control I/O device which is provided on the I/O area of the IC chip. When the IC chip is mounted on a different system, the self-control I/O device can automatically detect the I/O characteristics required by that system and then set itself automatically to the required I/O characteristics.

Figure 15:
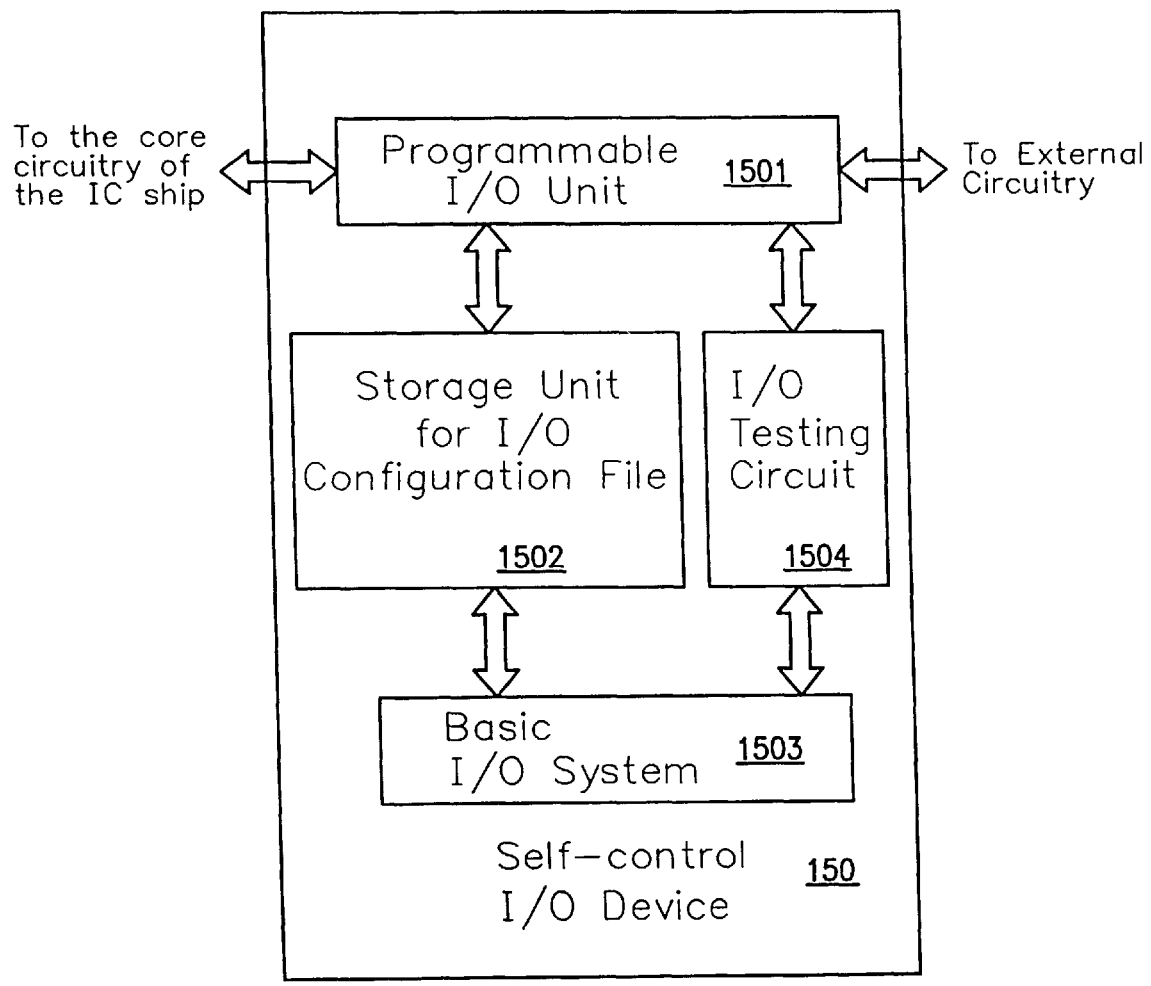
FIG. 15 is a schematic diagram of a self-control I/O device according to the invention.

FIG. 15 is a schematic diagram showing the architecture of this self-control I/O device, which is designated by the reference numeral 150. As shown, the self-control I/O device 150 includes a programmable I/O unit 1501, a permanent storage unit 1502 for storing a predefined I/O configuration file therein, an I/O testing circuit 1504, and a basic I/O system 1503. The programmable I/O unit 1501 can be set to one of a plurality of combinations of built-in I/O characteristics through programming by using the I/O configuration file stored in the storage unit 1502. The programmable I/O unit 1501 and the I/O configuration file are identical in functionality as the programmable I/O unit 51 described earlier with reference to FIG. 5, so description thereof will not be further detailed.

When the external system on which the self-control I/O device 150 is mounted is started, the basic I/O system 1503 will first command the I/O testing circuit 1504 to detect whether the I/O characteristics of the programmable I/O unit 1501 are matched to the external system. If not, the I/O testing circuit 1504 generate a change request signal to the basic I/O system 1503. In response to this signal, the basic I/O system 1503 will accordingly fetch the corresponding control word from the I/O configuration file stored in the storage unit 1502 and then forward it to the programmable I/O unit 1501, thereby setting the programmable I/O unit 1501 to the required I/O characteristics that are matched to the external circuitry.

In conclusion, the self-control I/O device of the invention has the following advantages. First, the self-control I/O device can be set to one of a plurality of combinations of various built-in I/O characteristics. Second, the self-control I/O device can be automatically set to the required I/O characteristics to match the external circuitry. Third, the invention allows the IC chips provided with the self-control I/O device to be automatically matched to the external circuitry through self-control means, thus allowing the IC products to be delivered to the customer without delay.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An I/O device for use on the I/O area of an IC chip, which comprises a programmable I/O unit serving as a data buffer between the core circuitry of the IC chip and the external circuitry to which the IC chip is connected for use, said programmable I/O unit being capable of being set to one of a plurality of combinations of built-in I/O characteristics; and I/O configuration means, coupled to said programmable I/O unit, for use to control said programmable I/O unit to be set to the desired combination of I/O characteristics that are matched to the external circuitry;

wherein said programmable I/O unit and said I/O configuration means are both integrally formed on the IC chip, allowing for a change in the I/O characteristics of said I/O device to match to the external circuitry.

2. The I/O device of claim 1, wherein said programmable I/O unit includes:

an output buffer serving as an output data buffer for the data output from the core circuitry of the IC chip to the external circuitry, capable of being set to an output characteristic selected from a plurality of built-in output characteristics through programming by using said I/O configuration means; and an input receiver serving as an input data buffer for the data input from the external circuitry to the core circuitry of the IC chip, capable of being set to an input characteristic selected from a plurality of built-in input characteristics through programming by using said I/O configuration means.

3. The I/O device of claim 2, wherein said output buffer includes:

an output pre-driver coupled to the core circuitry of the IC chip to receive the data output therefrom; and a P/N buffer, coupled between said output pre-driver and the external circuitry, capable of being set to one of a plurality of built-in output driving capabilities through programming by using said I/O configuration means.

4. The I/O device of claim 3, wherein said output pre-driver includes a plurality of output pre-driver units coupled to the core circuitry of the IC chip to receive the data output therefrom and also coupled to said I/O configuration means; and said P/N buffer includes a plurality of P/N buffer units each being paired to one of said output pre-driver units in said output pre-driver;

wherein each of the paired output pre-driver units and P/N buffer units is provided with a unique built-in output driving capability, allowing the output buffer to be set to one of a plurality of output driving capabilities through programming by using said I/O configuration means.

5. The I/O device of claim 2, wherein said output buffer includes:

a plurality of output pre-driver units whose input ends are tied together to the core circuitry of the IC chip to receive the data output therefrom and also coupled to said I/O configuration means; and a plurality of P/N buffer units each being paired to one of said output pre-driver units;

wherein each of the paired output pre-driver units and P/N buffer units is provided with a unique built-in output driving capability, allowing the output buffer to be set to one of a plurality of output driving capabilities through programming by using said I/O configuration means.

6. The I/O device of claim 5, wherein each of said output pre-driver includes a plurality of output pre-driver units coupled to the core circuitry of the IC chip to receive the data output therefrom and also coupled to said I/O configuration means; and each of said P/N buffer includes a plurality of P/N buffer units each being paired to one of said output pre-driver units in said output pre-driver;

wherein each of the paired output pre-driver units and P/N buffer units is provided with a unique built-in output driving capability, allowing the output buffer to be set to one of a plurality of output driving capabilities through programming by using said I/O configuration means.

7. The I/O device of claim 2, wherein said input receiver includes:

a plurality of input receiver units coupled in parallel between the external circuitry and the core circuitry of the IC chip to receive the data input from the external circuitry, each having a unique built-in input characteristic; said input receiver units being further coupled to said I/O configuration means to be selectively enabled for use by said I/O configuration means allowing said input receiver to be set to a desired input characteristic.

8. The I/O device of claim 1, wherein said I/O configuration means includes a permanent storage unit for storing an I/O configuration file therein.

9. The I/O device of claim 1, wherein said I/O configuration means is formed on the center area of the IC chip.

10. A self-control I/O device for use on the I/O area of an IC chip, capable of detecting the I/O requirements of the external circuitry to which the IC chip is connected for use and then self adjusting its I/O characteristics to meet the I/O requirements of the external circuitry, said self-control I/O device comprising:

a programmable I/O unit serving as a data buffer between the core circuitry of the IC chip and the external circuitry to which the IC chip is connected for use, said programmable I/O unit being capable of being set to one of a plurality of combinations of built-in I/O characteristics;

I/O configuration means, coupled to said programmable I/O unit, for use to control said programmable I/O unit to be set to the desired combination of I/O characteristics that are matched to the external circuitry;

an I/O testing circuit, coupled to said programmable I/O unit, capable of detecting whether the programmable I/O unit is matched to the external circuitry; if not, said basic I/O system generating a change request signal; and a basic I/O system, coupled to both of said I/O testing circuit and said I/O configuration means; in response to said change request signal from said I/O testing circuit, said basic I/O system requesting said I/O configuration means to send a corresponding I/O configuration signal to set said programmable I/O unit to the required set of I/O characteristics.

11. The I/O device of claim 10, wherein said programmable I/O unit includes:

an output buffer serving as an output data buffer for the data output from the core circuitry of the IC chip to the external circuitry, capable of being set to an output characteristic selected from a plurality of built-in output characteristics through programming by using said I/O configuration means; and an input receiver serving as an input data buffer for the data input from the external circuitry to the core circuitry of the IC chip, capable of being set to an input characteristic selected from a plurality of built-in input characteristics through programming by using said I/O configuration means.

12. The I/O device of claim 11, wherein said output buffer includes:

an output pre-driver coupled to the core circuitry of the IC chip to receive the data output therefrom; and a P/N buffer, coupled between said output pre-driver and the external circuitry, capable of being set to one of a plurality of built-in output driving capabilities through programming by using said I/O configuration means.

13. The I/O device of claim 12, wherein said output pre-driver includes a plurality of output pre-driver units coupled to the core circuitry of the IC chip to receive the data output therefrom and also coupled to said I/O configuration means; and said P/N buffer includes a plurality of P/N buffer units each being paired to one of said output pre-driver units in said output pre-driver;

wherein each of the paired output pre-driver units and P/N buffer units is provided with a unique built-in output driving capability, allowing the output buffer to be set to one of a plurality of output driving capabilities through programming by using said I/O configuration means.

14. The I/O device of claim 11, wherein said output buffer includes:

a plurality of output pre-driver units whose input ends are tied together to the core circuitry of the IC chip to receive the data output therefrom and also coupled to said I/O configuration means; and a plurality of P/N buffer units each being paired to one of said output pre-driver units;

wherein each of the paired output pre-driver units and P/N buffer units is provided with a unique built-in output driving capability, allowing the output buffer to be set to one of a plurality of output driving capabilities through programming by using said I/O configuration means.

15. The I/O device of claim 14, wherein each of said output pre-driver includes a plurality of output pre-driver units coupled to the core circuitry of the IC chip to receive the data output therefrom and also coupled to said I/O configuration means; and each of said P/N buffer includes a plurality of P/N buffer units each being paired to one of said output pre-driver units in said output pre-driver;

wherein each of the paired output pre-driver units and P/N buffer units is provided with a unique built-in output driving capability, allowing the output buffer to be set to one of a plurality of output driving capabilities through programming by using said I/O configuration means.

16. The I/O device of claim 11, wherein said input receiver includes:

a plurality of input receiver units coupled in parallel between the external circuitry and the core circuitry of the IC chip to receive the data input from the external circuitry, each having a unique built-in input characteristic; said input receiver units being further coupled to said I/O configuration means to be selectively enabled for use by said I/O configuration means allowing said input receiver to be set to a desired input characteristic.

17. The I/O device of claim 10, wherein said I/O configuration means includes a permanent storage unit for storing an I/O configuration file therein.

18. The I/O device of claim 10, wherein said I/O configuration means is formed on the center area of the IC chip.

* * * * *